United States Patent
Farley et al.

(10) Patent No.: US 6,878,946 B2
(45) Date of Patent: Apr. 12, 2005

(54) INDIRECTLY HEATED BUTTON CATHODE FOR AN ION SOURCE

(75) Inventors: Marvin Farley, Ipswich, MA (US); Takao Sakase, Rowley, MA (US); Shu Satoh, Byfield, MA (US); Geoffrey Ryding, Manchester, MA (US); Peter Rose, Rockport, MA (US); Christos Christou, West Suxex (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/259,827

(22) Filed: Sep. 30, 2002

(65) Prior Publication Data

US 2004/0061068 A1 Apr. 1, 2004

(51) Int. Cl.⁷ ................................................ H01J 37/08
(52) U.S. Cl. ..................... 250/427; 250/426; 250/424
(58) Field of Search ............................. 250/427, 426, 250/424, 423 R, 492.21

(56) References Cited

U.S. PATENT DOCUMENTS

| | | | |
|---|---|---|---|
| 3,869,632 A | | 3/1975 | Schlulz |
| 4,667,111 A | | 5/1987 | Glavish et al. |
| 5,350,969 A | * | 9/1994 | Gattuso ..................... 313/446 |
| 5,374,828 A | | 12/1994 | Boumsellek et al. |
| 5,497,006 A | | 3/1996 | Sferlazzo et al. |
| 5,703,372 A | * | 12/1997 | Horsky et al. .......... 250/423 R |
| 5,763,890 A | * | 6/1998 | Cloutier et al. ............. 250/427 |
| 6,583,544 B1 | * | 6/2003 | Horsky et al. ........... 313/359.1 |
| 2001/0043040 A1 | | 11/2001 | Olson et al. |

FOREIGN PATENT DOCUMENTS

| EP | 1056113 A2 | 11/2000 |
|---|---|---|
| WO | WO 03/075305 | 9/2003 |

OTHER PUBLICATIONS

Jonoshita, et al.; ELS2: Extended Life Source with Dual Cathode; IEEE 1999; pp. 239–242.
Patent Abstracts of Japan, vol. 007, No. 204 (E–197), Sep. 9, 1983, & JP 58 102440A (Tokyo Shibaura Denki KK), Jun. 18, 1983.
International Search Report for WO 03/075305 A2, dated Oct. 9, 2003.

* cited by examiner

*Primary Examiner*—Nikita Wells
*Assistant Examiner*—Anthony Quash
(74) *Attorney, Agent, or Firm*—Boult Wade Tennant

(57) ABSTRACT

An indirectly heated button cathode for use in the ion source of an ion implanter has a button member formed of a slug piece mounted in a collar piece. The slug piece is thermally insulated from the collar piece to enable it to operate at a higher temperature so that electron emission is enhanced and concentrated over the surface of the slug piece. The slug piece and collar piece can be both of tungsten. Instead the slug piece may be of tantalum to provide a lower thermionic work function. The resultant concentrated plasma in the ion source is effective to enhance the production of higher charge state ions, particularly $P^{+++}$ for subsequent acceleration for high energy implantation.

28 Claims, 2 Drawing Sheets

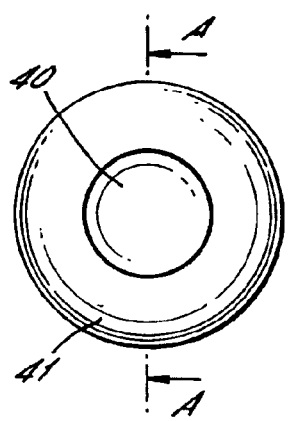
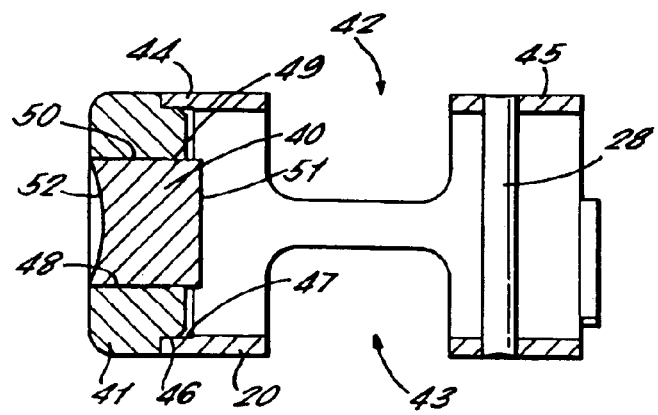
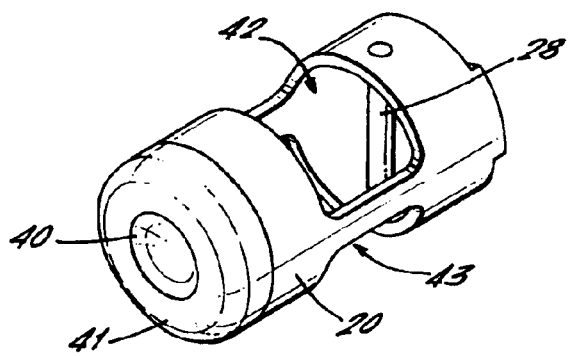

INDIRECTLY HEATED BUTTON CATHODE FOR AN ION SOURCE

This application claims priority under 35 U.S.C. §119(a) on patent application Ser. No(s). 10/091,351 filed in the United States on Mar. 6, 2002, the entire contents of which are hereby incorporated by reference.

FIELD OF THE INVENTION

This invention relates to an indirectly heated button cathode for an ion source, in particular for use in an ion implanter for implanting ions into target substrates such as semiconductor wafers.

BACKGROUND OF THE INVENTION

It is known to use indirectly heated cathodes in the arc chambers of ion sources. In such arrangements, the cathode is formed as a button having a front thermionic electron emitting surface and a rear surface. The button is typically heated by electron impact on the rear surface, by electrons emitted and accelerated from a filament located behind the rear surface of the cathode button. With this construction, the filament is protected from sputtering by energetic particles in the arc plasma formed in the arc chamber of the ion source. The heated cathode button emits thermionic electrons at its front surface, and these are accelerated by the arc potential in the arc chamber, to initiate and maintain the required arc. The cathode button can be made relatively thick and substantial, by comparison to directly heated filament cathodes, to give the cathode longer life in operation.

An indirectly heated button cathode for an ion source is disclosed in U.S. Pat. No. 5,497,006.

Certain processes in the manufacture of semiconductor devices require the implantation of atomic species at relatively high energies, so that the species are implanted at greater depths in the semiconductor substrate. High energy ion implanters are disclosed in U.S. Pat. Nos. 4,667,111 and in 6,423,976. These prior art high energy implanters use rf linear accelerators to accelerate the ions to the high energies required for implantation. Other forms of high energy accelerators are also known for use in ion implanters, including radio frequency quadrupole (RFQ) accelerators and tandetron accelerators. Such devices have been used to produce singly charged ions of species desired for implantation at energies up to between 500 KeV and 2 MeV. Fixed voltage electrostatic accelerators are also known which can provide singly charged ions at energies in excess of 200 KeV. However, for higher energies it is known to use ions of the desired species at higher charge states, typically doubly or triply charged. The energy delivered to a charged particle by an electric field is directly proportional to the number of charges on the particle.

The operation of ion sources can be optimised to enhance the production of ions at higher charge states. However this usually involves operating the ion source with a more intense arc, so that the life of consumable elements within the ion source, particularly the cathode, is reduced. A compromise is usually made between cathode life and the beam current at the desired higher charge state.

Attempts have been made to improve the performance of ion sources in order to maximise cathode life, while operating the cathode to generate relatively high currents of desired multiply charged species. For example, "ELS2: Extended Life Source With Dual Cathode", I. Jonoshita et al, Ion Implantation Technology—98 pp.239–241, describes a scheme using a second button cathode in the arc chamber of an ion source to replace the usual electron reflector. A modest increase in life time is demonstrated. Reference may also be made to U.S. Pat. No. 5,703,372.

SUMMARY OF THE INVENTION

It is an object of the present invention to provide an improved cathode structure for the ion source of an ion implanter to enable the ion source to be optimised for the production of multiple charge state ions with a satisfactory cathode life time.

Accordingly, the invention provides an indirectly heated cathode for an ion source comprising a button member having a front face for emitting thermionic electrons, when in use, to form a plasma and a rear face opposite to said front face for exposure to electron heating in use, the button member comprising a collar piece and a slug piece secured in the collar piece, the slug piece providing respective central portions of the front and rear faces of the button member and the collar piece providing respective peripheral portions of the front and rear faces surrounding said central portions, the button member having a thermal barrier between the slug piece and the collar piece so that the central portion of the front face of the button member is at a higher temperature than the peripheral portion thereof, when the central portion of the rear face of the button member is electron heated in use.

Because of the thermal barrier between the central slug piece of the button member and the collar piece, the thermal mass to be heated is reduced and the central portion of the front face of the button member can be heated to a higher temperature to increase thermionic emission. The electron emission area of the cathode can therefore be reduced in size, resulting in a more concentrated plasma within the arc chamber. The more concentrated plasma tends to have a higher energy density resulting in more favourable production of ions at higher charge states. Both the slug piece and the collar piece of the button member may be of tungsten and can be made thicker to maximise cathode life.

The invention also provides an indirectly heated button cathode for an ion source, comprising a button member having a front face for emitting thermionic electrons, when in use, to form a plasma, said face for emitting having a central portion provided by a first material having a first thermionic work function and a peripheral portion, around said central portion, provided by a second material having a second thermionic work function greater than said first work function. Because the central portion of the electron emitting face of the button cathode has a lower work function than the peripheral portion, electron emission is concentrated, in use, from the central portion. In a particular embodiment, a slug of tantalum is fitted in a collar of tungsten in order to form the button member of the cathode.

The slug piece can be made thicker than the collar piece, so that the slug protrudes rearwards of the rear face of the button. As a result, the rear face of the slug piece receives the dominant part of the electron heating by the accelerated electrons from the filament located behind the cathode button member.

Also, the front face of the slug piece, forming the central portion of the thermionic electron emitting face of the button member, may be made concave. This produces a slight focus of the primary electrons emitted from the front face, so as further to increase the energy density of the plasma.

The modified button cathode can be used to replace prior art button cathodes, typically having a solid tungsten button member, with minimum additional modification of the ion source.

BRIEF DESCRIPTION OF THE DRAWINGS

An example of the invention will now be described with reference to the accompanying drawings in which:

FIG. 2 is a front view of the modified button cathode embodying the invention;

FIG. 3 is a cross-sectional view of the button cathode, taken along line A—A of FIG. 2; and FIG. 4 is a perspective view of the button cathode.

DETAILED DESCRIPTION OF THE PREFERRED EMBODIMENT

Figure 1:
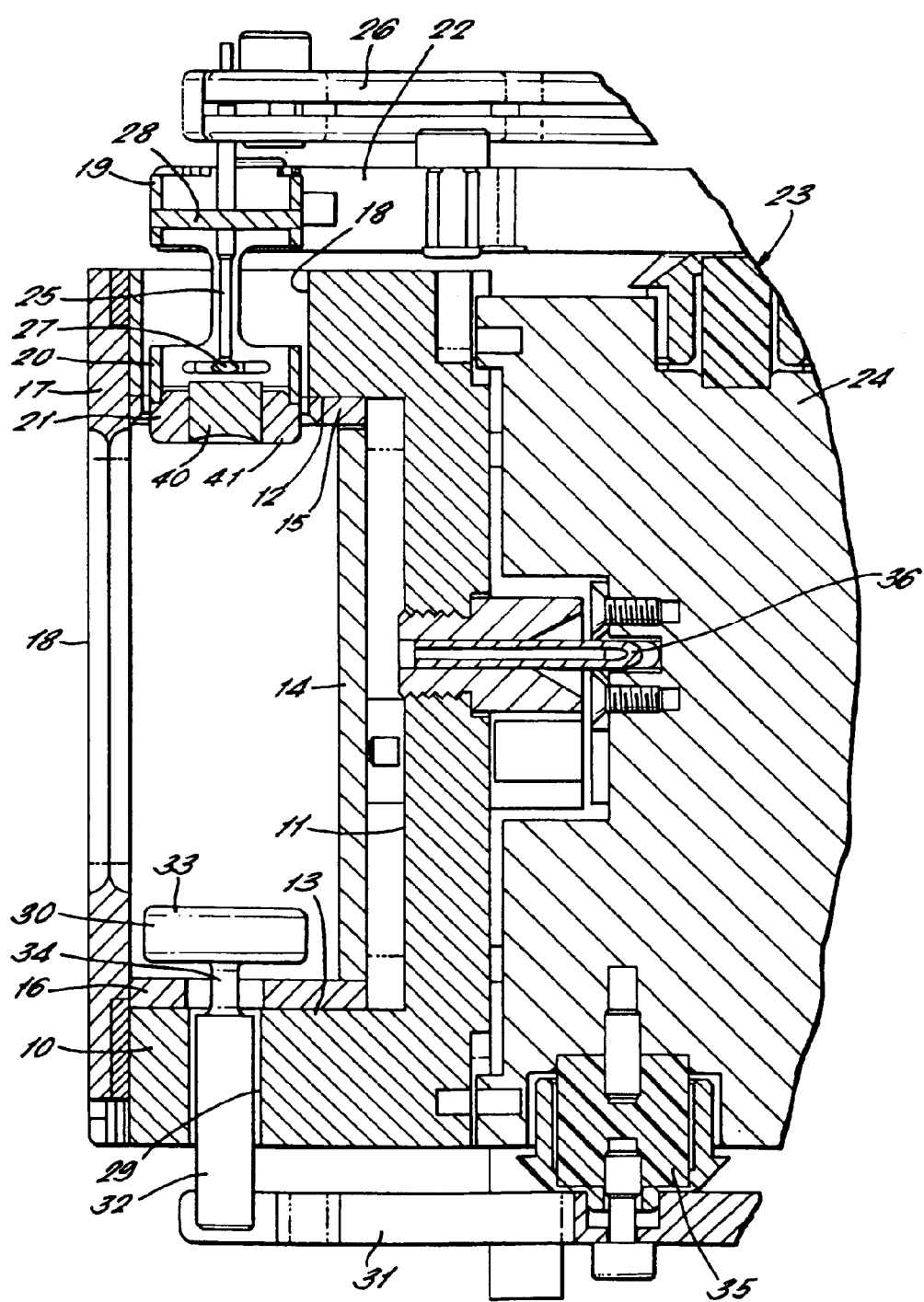
FIG. 1 is a cross-sectional view of the arc chamber of an ion source for use in an ion implanter and including a modified button cathode embodying the present invention.

In the description and claims that follow, relative terms such as upper and lower, rear and front have been used for simplicity of description. Upper and lower have been used only with reference to the orientation of the example illustrated in FIG. 1 of the drawings, and, in an actual installation of the embodiment, any orientation relative to vertical is feasible. Rear and front have been used such that the distinction should be apparent from the context. For example, the terms are used with reference to the arc chamber in accordance with the convention that the ion beam is emitted from the front. Similarly, the term front is used with reference to the face of the button member of the cathode to denote the face which is directed away from the neighbouring arc chamber wall and into the interior of the arc chamber.

In FIG. 1, the arc chamber of an ion source comprises an arc chamber body 10 having a rear wall 11 and upper and lower end walls 12 and 13. The rear wall 11 and upper and lower end walls 12 and 13 are protected by graphite liners 14, 15 and 16. The arc chamber has a front plate 17 which provides a slit opening 18 through which ions formed in the arc chamber can be extracted to provide the required ion beam.

The upper end wall 12 of the arc chamber body 10 has an aperture 18 in which is mounted a cathode structure 19. The cathode structure 19 comprises a cylindrical body 20 bearing a button member 21 at its lower end. The cylindrical body is clamped in position by clamping members 22 which are in turn secured on electrically insulating mounts 23 to an ion source part 24 at the rear of the arc chamber body 10. The clamping members 22 hold the cylindrical body 20 of the cathode structure in spaced relation to the aperture 18 through the upper end wall 12 of the arc chamber body, and a corresponding aperture through the graphite liner 15, with the button member 21 penetrating a short distance into the interior of the arc chamber.

A tungsten filament 25 is also clamped by additional clamping members 26 so that filament element 27 is positioned a short distance to the rear of button member 21 within the cylindrical cathode body 20.

In the described embodiment, a bar 28 is secured across the outer end of the cylindrical cathode body 20, and one connecting lead to the filament element 27 extends on each side of the bar 28 out through the upper open end of the cylindrical cathode body 20 to be secured in the clamping member 26.

The lower end wall 13 of the arc chamber body 10 has an aperture 29 communicating with the inside of the arc chamber through a corresponding aperture in the graphite liner 16. An anti-cathode or electron reflector 30, typically of tungsten, is mounted by means of a clamping arrangement 31 so as to extend through the aperture 29. The electron reflector 30 is formed with a shaft portion 32 having an outer end held in the clamp 31, extending in spaced relationship with the interior wall surface of the aperture 29. The shaft portion 32 is connected to a head portion 33 by means of a neck portion 34. The head portion 33 is circular about the axis of the shaft portion 32 and has a diameter substantially the same as or slightly greater than the diameter of the button member 21 of the cathode structure 19, and an axial thickness of about 6 mm. The clamping arrangement 31 supporting the electron reflector 30 is itself mounted by an insulating mount 35 on the ion source part 24.

A feed tube 36 is fitted through the rear wall 11 of the arc chamber body 10, in order to provide a feed of a desired process gas to the arc chamber for generating desired ions for implantation.

The ion source arc chamber described above and illustrated in FIG. 1 is of the Bernas type and as will be known to the skilled person, a magnetic field extending axially between the cathode and the electron reflector is provided by magnet arrangements which are not shown in FIG. 1.

In operation, a filament current from a filament supply (not shown) flows through the tungsten filament 27. The filament 27 is also biased negatively relative to the cathode structure 19. Thermionic electrons emitted by the filament 27 are thus accelerated to impact the rear face of the cathode button member 21, in order to heat the button member to a required thermionic electron emission temperature. The cathode structure 19, including the button member 21, is itself negatively biased by an arc supply, so as to provide an arc potential between the button member 21 and the body 10 of the arc chamber. Thermionic electrons emitted from the front (lower) face of the button member 21 are confined by the magnetic field to travel substantially axially between the cathode button member 21 and the head 33 of the electron reflector 32. The electron reflector 32 is typically also biased relative to the cathode body 10, at the same potential as the cathode structure 19.

The energetic primary thermionic electrons from the cathode button member 21 ionise molecules of the process gas fed into the arc chamber by the feed tube 36, to produce a plasma in the arc chamber in the space between the cathode button member 21 and the head 33 of the electron reflector. As is known to those skilled in this art, the process feed gas is selected to include atoms of the species to be implanted and the plasma within the arc chamber may produce ions of various molecular and atomic species resulting from dissociation of the feed gas molecules. Furthermore, it is known that the gaseous species in the plasma in the arc chamber may be ionised to different charge states. Higher charge states are typically generated as a result of increased energy density within the plasma.

As can be seen in FIG. 1, the button member 21 of the cathode structure 19 comprises a central stud or slug piece 40 fitted in an outer collar piece 41. This structure will be described in greater detail with reference to FIGS. 2 to 4. The cathode structure comprises a cylindrical body 20 which is typically made of tungsten. The body 20 has opposed cutouts 42 and 43, essentially dividing the cylindrical body into an inner end 44 carrying the collar piece 41 of the button member 21, and an outer end 45 by which the cathode structure is secured by the clamping arrangement 22 as shown in FIG. 1. The collar piece 41 of the button member is formed with an external annular rebate 46 which forms a press fit with a slightly rebated inside edge 47 of the inner end 44 of the cathode body 20. In assembly, the collar 41 is also formed of tungsten and is press fitted to engage with the inner end of the cathode body 20. The two parts are then electron beam welded together.

The collar piece 41 carries the cylindrical slug piece 40 of the cathode button member. The slug piece 40 in this example is also made of tungsten. The slug piece 40 is fitted in a cylindrical bore 48 in the collar piece 41. The bore 48 has a first outer length portion 50 adjacent the front face of the button member and a second inner length portion 49 adjacent the rear face of the button member. The inner portion 49 has a diameter slightly less than the diameter of the outer portion 50 of the bore 48. The difference in diameter may be as small as about 0.2 mm. The outer diameter of the slug piece 40 may be substantially the same as the diameter of the outer portion 50 of the bore 48. On assembling the parts, the slug piece 40 is shrink fitted into the bore 48, by cooling the slug piece 40 in liquid nitrogen. Then, the primary connection between the slug piece 40 and the collar piece 41 is only at the inner portion 49 of the bore 48 and the slug piece 40 fits freely in the outer portion 50 of the bore 48. As a result, the thermal conduction between the slug piece 40 and the collar piece 41 is reduced and a thermal barrier is formed between the two parts.

The axial length of the inner portion 49 of the bore 48 is preferably significantly less than (typically no more than 20% of) the length of the outer portion 50 so as to minimise the surface area of good thermal contact between the slug piece 40 and the collar piece 41.

In the illustrated example, the bore 48 has a total axial length of about 6 mm and the inner portion 49 has a length of about 1 mm.

The free fit between the slug piece 40 and the collar piece 41 over the greater part of the bore 48 provides a poor thermal contact over this region. The outer portion 50 of the bore 48 may be slightly larger in diameter than the slug piece 40 to provide a small annular gap between the two parts during operation. However any such gap should be as small as possible consistent with the requirement that heat loss by conduction from the slug piece 40 over the axial length of the outer portion 50 of the bore 48 is reduced.

The thermal barrier between the slug piece 40 and the collar piece 41 may be produced by any technique which reduces the contact area between the two parts, while still permitting the collar piece 41 to have substantial axial thickness approaching that of the slug piece 40. For example, the inner portion 49 of the bore 48 may be formed to have, in axial cross-section, a pyramidal or trapezoidal shape to reduce further the contact area with the slug piece 40.

Also, instead of the collar piece 41 having the reduced diameter inner portion 49, the bore 48 may have a uniform diameter sized to provide a free fit over most of the length of the slug piece 40, and the slug piece 40 may then have an enlarged annular rib at an axial position to grip the inner end of the bore 48.

As can be seen in FIG. 3, the slug piece 40 has a rear face 51 protruding rearwardly by a short distance, typically about 1 mm, beyond the rear face of the collar piece 41. Also, the front face 52 of the slug piece 40 is formed to be spherically concave. In one example, the slug piece may have a length of about 7 mm and a diameter of about 8 mm and the radius of curvature of the concave front surface 52 of the slug piece may be about 10 mm. In this example, the outer diameter of the collar piece 41 may be about 16 mm and the axial thickness may be about 6 mm.

The indirectly heated button cathode described above and illustrated in the drawings has a number of advantages over prior art cathodes.

Because the slug piece 40 protrudes rearwardly relative to the collar piece 41 as shown in FIG. 3, the electric field between the filament 27 (FIG. 1) inside the cathode body 20, and the rear of the button member 21, is enhanced over the rear face 51 of the slug piece 40. As a result, heating of the button member by the electron flux from the filament 27 is concentrated over the rear face of the slug piece.

Because of the thermal break provided by the method of securing the slug piece 40 within the collar piece 41, thermal conduction from the slug piece 40 to the collar piece 41 is reduced. The thermal mass to be heated by electron impact on the rear face 51 is accordingly reduced, as are thermal losses from the slug piece 40 itself. In practice the rear face 51 of the slug piece 40 may be heated close to the melting point of the material used, e.g. tungsten. The thermal break allows the front face 52 of the slug piece 40 to operate at a higher temperature, thereby enhancing thermionic emission of electrons from the front face 52, i.e. the central portion of the front face of the button member.

Importantly, the front face of the collar piece 41 is in substantially the same plane as the front face of the slug piece 40 and the slug and collar pieces have nearly the same axial length. This prevents premature failure of the cathode by erosion of the collar piece during operation. Also, because the mechanical connection between the slug piece 40 and the collar piece 41 is adjacent to the inner face of the collar piece, the cathode can tolerate erosion of nearly the full axial thickness of the collar piece 41 before failure. The design provides the benefit of a button member having substantial axial thickness over the full front face area of the button member and yet avoids the consequential problem of the high thermal mass of the whole button member by providing the thermal barrier.

The concave shape of the front face 52 of the slug piece 40 tends to concentrate thermionically emitted electrons towards the axis of the arc chamber.

These features identified above serve to enhance the concentration of plasma generated in the arc chamber, enabling an increased plasma density, whilst maintaining a satisfactory cathode life time. This permits the arc chamber to be operated to optimise the production of ion species at higher charge states. In particular the ion source can be optimised for the production of triply charged phosphorus ions.

For an arc voltage of 100 Volts and an arc current of about 2.7 Amps, the lifetime of the cathode embodying the invention and described above is more than 50 hours when continuously running a $P^{+++}$ beam of 1.7 mA. By comparison a prior art cathode with a solid tungsten button member under the same arc voltage and arc current provides a $P^{+++}$ beam current of only 0.5 mA and burns out in just 16 hours.

In another embodiment, the slug piece 40 is made of tantalum. Tantalum has a lower thermionic work function (4.25 eV) than tungsten (4.55 eV). As a result, when the button member comprising the tantalum slug piece 40 and tungsten collar piece 41 is heated, electrons are thermionically emitted preferentially from the front face 52 of the tantalum slug piece 40, even if the front face portions of both the slug piece 40 and the surrounding collar piece 41 are at the same temperature. Instead of tungsten and tantalum, other materials having appropriate work functions may be employed for the collar piece 41 and slug piece 40 For example the collar could be made of Rhenium (work function 4.96 eV), in combination with a slug of Ta or W.

It has also been observed that the Ta slug cathode produces less spurious arcing during operation. This may be because the Ta slug piece is operating near its melting point (about 2850° C.), and therefore recrystallises quickly, eliminating small grain structure. Sputtering of the cathode during operation can cause the small grains to become dislodged and cause a spurious arc discharge.

The counter cathode 30 may also made of tantalum. This can contribute to improved performance by reducing spurious arcing as outlined above.

In other examples of the invention, the central portion of the button member, may have a lower thermionic work function than the collar portion but without the thermal break between the two portions. In further examples the central portion may have a flat electron emitting face or may have the same axial thickness as the rest of the button member portion. In a still further example, the button member may be made as a single disc of tungsten or tantalum with at least a central part of the front electron emitting face formed to be concave.

Other arrangements are also within the scope of the invention as defined by the following claims.

What is claimed is:

1. An indirectly heated cathode for an ion source comprising:
   a button member having a front face for emitting thermionic electrons, when in use, to form a plasma and a rear face opposite to said front face for exposure to electron heating in use, the button member comprising a collar piece and a slug piece secured in the collar piece,
   the slug piece providing respective central portions of the front and rear faces of the button member, and the collar piece providing respective peripheral portions of the front and rear faces surrounding said central portions,
   the button member having a thermal barrier between the slug piece and the collar piece so that the central portion of the front face of the button member is at a higher temperature than the peripheral portion thereof, when the central portion of the rear face of the button member is electron heated in use.

2. An indirectly heated cathode as claimed in claim 1, wherein the peripheral portion of said front face provided by the collar piece is substantially co-planar with at least a circumferential part of the central portion of said front face provided by the slug piece.

3. An indirectly heated cathode as claimed in claim 1, wherein the collar piece has a central bore accommodating the slug piece, and one of the central bore and the slug piece has a first length portion in said bore adjacent said front face which is sized to provide a free fit between the collar piece and the slug piece along said first length portion and a second length portion in said bore adjacent said peripheral portion of said rear face which is sized to grip the slug piece in the collar piece, the second length portion extending less than half the total length of said bore.

4. An indirectly heated cathode as claimed in claim 3, wherein the second length portion extends less than 20% of the total length of the bore.

5. An indirectly heated cathode as claimed in claim 1, wherein the slug piece protrudes rearwardly relative to the collar piece so that the central portion of the rear face of the button member is rearward of the peripheral portion of said rear face.

6. An indirectly heated cathode as claimed in claim 1, wherein the slug piece and the collar piece of the button member are made of the same material.

7. An indirectly heated cathode for an ion source, comprising:
   a tubular support by which the cathode is held in position in an arc chamber of an ion source, said tubular support having a front end to be directed, in use, into the arc chamber, and a rear end to be directed, in use, outwards from the arc chamber;
   a collar piece partially closing the front end of the tubular support and defining a central bore extending through the collar piece;
   a slug piece secured in said central bore and having an outwardly directed front face for emitting thermionic electrons, in use, to form a plasma in the arc chamber;
   an inwardly directed rear face for exposure to electron heating, in use; and
   a thermal barrier between the slug piece and the collar piece to restrict thermal conduction from the slug piece to the collar piece.

8. An indirectly heated button cathode for an ion source, comprising:
   a button member having a front face for emitting thermionic electrons, when in use, to form a plasma and a rear face opposite to said front face, for exposure to electron heating in use, said button member including a collar and a slug secured in said collar, the slug providing respective central portions of the front and rear faces of the button member and being formed of a first material having a first thermionic work function, and the collar providing respective peripheral portions of said front and rear faces around said central portions and being formed of a second material having a second thermionic work function greater than said first work function.

9. An indirectly heated button cathode as claimed in claim 8, wherein said central portion is circular and said peripheral portion is annular.

10. An indirectly heated button cathode as claimed in claim 8, wherein said slug protrudes rearwards relative to said collar.

11. An indirectly heated button cathode as claimed in 8, wherein at least part of said face for emitting is concave.

12. An indirectly heated button cathode as claimed in claim 11, wherein said central portion of said face for emitting is concave.

13. An indirectly heated button cathode as claimed in claim 8, wherein said second material is tungsten.

14. An indirectly heated button cathode as claimed in claim 13, wherein said first material is tantalum.

15. An indirectly heated cathode for an ion source as claimed in claim 8, wherein said front face is circular having a concentric central portion and an annular outer portion, wherein only said central portion is concave.

16. An indirectly heated cathode for an ion source comprising:
   a button member having a front face for emitting thermionic electrons, when in use, to form a plasma, said button member having a rear face opposite to said front face for exposure to electron heating in use, said rear face having a central portion and an exposed surrounding portion, said central portion protruding rearwardly relative to said surrounding portion, said button member comprising a collar piece and a slug piece secured in said collar piece,
   said slug piece protruding rearwardly to form said central portion of said rear face, wherein said slug piece provides a central portion of said front face of the button member and
   said collar piece provides a peripheral portion of said front surface surrounding said central portion, said slug piece being secured in said collar piece so as to provide a temperature difference between said slug piece and said collar piece when said central portion of said rear face of the button member is exposed to electron heating.

17. A method of creating a plasma for use in ion implantation comprising:

providing an arc chamber with an indirectly heated button cathode having a button member with a front face for emitting thermionic electrons into said arc chamber for acceleration therein to form a plasma and a rear face;

forming a slug to provide respective central portions of the front and rear faces of a first material having a first thermionic work function;

forming a collar to provide respective peripheral portions of said faces, of a second material having a second thermionic work function greater than said first work function;

securing said slug in said collar so that said peripheral portions of said faces surround said central portions;

accelerating electrons, thermionically emitted by a filament onto the rear face of said button member, to heat said button member to cause thermionic emission of electrons from at least said central portion of said front face provided by said slug; and electrically biasing said cathode to accelerate said thermionically emitted electrons from said front face of said button member to ionise gas molecules in said arc chamber to produce a plasma therein.

18. An ion source comprising:

an arc chamber having first and second opposed walls;

an indirectly heated button cathode located in said first wall; and an electron reflector located in said second wall, said button cathode having a disc-shaped button member with a generally circular front face for emitting thermionic electrons, when in use, to form a plasma in said arc chamber, and a rear face opposite to said front face, for exposure to electron heating in use, said button member including a collar and a slug secured in said collar, the slug providing respective central portions of the front and rear faces of the button member and being formed of a first material having a first thermionic work function, and the collar providing respective peripheral portions of said front and rear faces around said central portions, and being formed of a second material having a second thermionic work function greater than said first work function, said electron reflector having a disc-shaped head member providing a generally circular reflecting face formed of said first material directed towards said front face of said button member, and a magnet to provide a magnetic field in said arc chamber aligned between said front face of said button member and said reflecting face of said head member to confine electrons to a column extending in said arc chamber between said cathode and said electron reflector.

19. An ion source as claimed in claim 18, wherein said first material is tantalum and said second material is tungsten.

20. A method of creating a plasma for use in providing an indirectly heated button cathode having ion implantation, comprising the steps of:

a button member with a front face and a rear face, said button member comprising a collar piece and a central slug piece secured in the collar piece, the slug piece providing respective central portions of said front and rear faces and the collar piece providing respective peripheral portions thereof;

accelerating thermionic electrons preferentially onto said central portion of said rear face to heat the slug piece relative to the collar piece to cause thermionic emission of electrons from said central portion of said front face;

providing a thermal barrier between the slug piece and the collar piece so that said central portion of the front face of the button member is hotter than said peripheral portion of said front face; and electrically biasing the cathode to accelerate said thermionically emitted electrons from said front face to ionize gas molecules to produce a plasma.

21. A method of forming a button member for an indirectly heated cathode for an ion source, the button member having a front face for emitting thermionic electrons, when in use, to form a plasma and a rear face opposite said front face for exposure to electron heating in use, the method comprising the steps of:

a) providing a collar piece and a slug piece for securing in the collar piece so that the slug piece provides respective central portions of said front and rear faces and the collar piece provides respective peripheral portions of the front and rear faces surrounding said central portions, the collar piece having a central bore to accommodate the slug piece wherein one of the central bore and the slug piece has a first length portion adjacent said front face which is sized to provide a free fit between the collar piece and the slug piece along said first length portion and a second length portion adjacent said peripheral portion of the rear face which is sized to grip the slug piece in the collar piece, the second length portion extending less than half of the total length of the bore;

b) generating a temperature differential between the slug piece and the collar piece so that differential thermal expansion and/or contraction of the slug piece and the collar piece permits the slug piece to be a sliding fit in the collar piece over said second length portion;

c) inserting the slug piece in the bore in the collar piece; and d) allowing the temperature of the slug piece and the collar piece to equalize so that the slug piece is gripped in the collar piece at said second length portion and a thermal barrier is provided between the slug piece and the collar piece over said first length portion.

22. A method of creating a plasma for use in ion implantation, comprising the steps of:

providing an indirectly heated button cathode having a button member with a front face and a rear face, said button member comprising a collar piece and a central slug piece secured in the collar piece, the slug piece provides respective central portions of said front and rear faces and the collar piece provides respective peripheral portions thereof;

accelerating thermionic electrons preferentially onto said central portion of said rear face to heat the slug piece relative to the collar piece to cause thermionic emission of electrons from said central portion of said front face;

reducing thermal conduction from the slug piece to the collar piece to provide a temperature difference between the slug piece and the collar piece; and electrically biasing the cathode to accelerate said thermionically emitted electrons from said front face to ionise gas molecules to produce a plasma.

23. An indirectly heated cathode for an ion source comprising:

a button member having a front face for emitting thermionic electrons, when in use, to form a plasma and a rear face opposite to said front face for exposure to electron heating in use, the button member comprising a collar piece and a slug piece secured in the collar piece, the slug piece providing respective central portions of the front and rear faces of the button member and the collar piece providing respective peripheral portions of the front and rear faces surrounding said central portions, said slug piece being secured in said collar piece so as to reduce thermal conduction from the slug piece to the collar piece and provide a temperature difference between the slug piece and the collar piece when the central portion of the rear face of the button member is electron heated in use.

24. An indirectly heated cathode as claimed in claim 23, wherein the peripheral portion of said front face provided by the collar piece is substantially co-planar with at least a circumferential part of the central portion of said front face provided by the slug piece.

25. An indirectly heated cathode as claimed in claim 23, wherein the collar piece has a central bore accommodating the slug piece, the central bore having an inner end having a reduced diameter, the slug piece being shrink fit secured in said reduced diameter inner end of the bore.

26. An indirectly heated cathode as claimed in claim 23, wherein the slug piece protrudes rearwardly relative to the collar piece so that the central portion of the rear face of the button member is rearward of the peripheral portion of said rear face.

27. An indirectly heated cathode as claimed in claim 23, wherein the slug piece and the collar piece of the button member are made of the same material.

28. An indirectly heated cathode for an ion source comprising:

a button member having a front face for emitting thermionic electrons, when in use, to form a plasma, said button member having a rear face opposite to said front face for exposure to electron heating in use, the button member includes a collar piece and a slug piece shrink fit secured in said collar piece, said slug piece providing respective central portions of the front and rear faces of the button member and said collar piece providing respective exposed surrounding portions of said front and rear faces, wherein said slug piece is secured in said collar piece so as to provide a temperature difference between said slug piece and said collar piece when said central portion of said rear face of the button member is exposed to electron heating.

* * * * *

UNITED STATES PATENT AND TRADEMARK OFFICE
CERTIFICATE OF CORRECTION

PATENT NO. : 6,878,946 B2
APPLICATION NO. : 10/259827
DATED : April 12, 2005
INVENTOR(S) : Marvin Farley et al.

It is certified that error appears in the above-identified patent and that said Letters Patent is hereby corrected as shown below:

ON THE TITLE PAGE OF THE PATENT:

At the left-hand portion, immediately below the section identified as "(23) ...," please insert the following new section:

On the title page please insert,
-- Related U.S. Application Data
(60) Continuation-in-Part of Application No. 10/091,351, filed on March 6, 2002. --

Signed and Sealed this

Twenty-sixth Day of December, 2006

JON W. DUDAS
*Director of the United States Patent and Trademark Office*